United States Patent
Ohta et al.

(10) Patent No.: US 11,414,741 B2
(45) Date of Patent: Aug. 16, 2022

(54) VAPOR DEPOSITION MASK AND VAPOR DEPOSITION DEVICE

(71) Applicant: SHARP KABUSHIKI KAISHA, Sakai (JP)

(72) Inventors: Yoshifumi Ohta, Sakai (JP); Masao Nishiguchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/981,968

(22) PCT Filed: Mar. 22, 2018

(86) PCT No.: PCT/JP2018/011509
§ 371 (c)(1),
(2) Date: Sep. 17, 2020

(87) PCT Pub. No.: WO2019/180893
PCT Pub. Date: Sep. 26, 2019

(65) Prior Publication Data
US 2020/0411804 A1    Dec. 31, 2020

(51) Int. Cl.
*C23C 14/04* (2006.01)
*H01L 51/56* (2006.01)
*H01L 51/00* (2006.01)

(52) U.S. Cl.
CPC ........... *C23C 14/042* (2013.01); *H01L 51/56* (2013.01); *H01L 51/0011* (2013.01)

(58) Field of Classification Search
CPC .................................................. C23C 14/042
See application file for complete search history.

(56) References Cited

U.S. PATENT DOCUMENTS

| | | | |
|---|---|---|---|
| 6,878,209 B2* | 4/2005 | Himeshima | H01L 27/3283 118/504 |
| 2001/0004469 A1* | 6/2001 | Himeshima | H01L 51/0011 427/66 |
| 2004/0197675 A1* | 10/2004 | Shibata | G03F 1/40 430/5 |
| 2005/0115503 A1* | 6/2005 | Hagiwara | H01L 51/0011 118/721 |
| 2017/0141313 A1* | 5/2017 | Min | C23C 14/08 |
| 2018/0155818 A1* | 6/2018 | Mu | C23C 14/12 |
| 2020/0190655 A1* | 6/2020 | Zhu | H01L 51/56 |

FOREIGN PATENT DOCUMENTS

| | | | | |
|---|---|---|---|---|
| CN | 107587106 | * | 1/2018 | ............ C23C 14/24 |
| JP | 2010-129345 A | | 6/2010 | |

* cited by examiner

*Primary Examiner* — Keath T Chen
(74) *Attorney, Agent, or Firm* — ScienBiziP, P.C.

(57) ABSTRACT

A vapor deposition mask used to manufacture a display device includes a notch portion. The vapor deposition mask is provided with an FMM sheet and a first cover sheet. The first cover sheet includes a trunk portion and a notch forming portion that protrudes from the trunk portion and prevents film formation on the notch portion, and the thickness of at least a part of the notch forming portion is smaller than the thickness of the trunk portion.

19 Claims, 8 Drawing Sheets

| | CONDITION I (RELATED ART) | CONDITION II | CONDITION III | CONDITION IV | CONDITION V | CONDITION VI | CONDITION VII | CONDITION VIII | CONDITION IX |
|---|---|---|---|---|---|---|---|---|---|
| THICKNESS A OF FMM SHEET | 20 μm | 25 μm | 20 μm | 25 μm | 20 μm | 25 μm | 25 μm | 25 μm | 25 μm |
| THICKNESS B OF FIRST COVER SHEET | 300 μm | 300 μm | 200 μm | 200 μm | 100 μm | 100 μm | 50 μm | 25 μm | 20 μm |
| B/A | 15 | 12.5 | 10 | 8 | 5 | 4 | 2 | 1 | 0.8 |
| COLOR MIXING LEVEL AROUND NOTCH PORTION | × | × | × | △ | ○ | ○ | ○ | ○ | ○ |
| VAPOR DEPOSITION LEVEL OF NOTCH PORTION (WRAPAROUND) | ○ | ○ | ○ | ○ | ○ | ○ | ○ | △ | × |
| OVERALL EVALUATION | × | × | × | △ | ○ | ○ | ○ | △ | × |

FIG. 11

VAPOR DEPOSITION MASK AND VAPOR DEPOSITION DEVICE

TECHNICAL FIELD

The disclosure relates to a vapor deposition mask and a vapor deposition device.

BACKGROUND ART

In the related art, electroluminescence (hereinafter referred to as "EL") displays that utilize the EL of organic materials, inorganic materials, or quantum dots are known. In these EL displays, in a step of forming a light-emitting layer, an RGB luminescent material is formed as a film in each of regions on a substrate on which a film is to be formed, using a fine metal mask (FMM) in which high-precision openings are provided at chosen positions.

Incidentally, in recent years, some of the EL displays include a notch portion for a fingerprint sensor or a camera, in a display area of a display screen. In the step of forming the light-emitting layer, in order to prevent film formation on the notch portion, a corresponding location on the FMM sheet is covered using a first cover sheet or the like.

CITATION LIST

Patent Literature

PTL 1: Japanese Patent Application Publication No. 2010-129345 A (published on Jun. 10, 2010)

SUMMARY

Technical Problem

Incidentally, in the step of forming the light-emitting layer, it is common to bring the FMM sheet and the first cover sheet into close contact with the substrate on which a film is to be formed, using a magnetic force of a magnet. However, in some cases, due to the magnetic force of the magnet, the FMM sheet may be displaced, or a gap may occur between the FMM sheet and the first cover sheet. If the displacement or the gap occurs with respect to the FMM sheet or the first cover sheet in this manner, there is a problem in that color drift (color mixing) occurs around the notch portion, or a display defect occurs as a result of the light-emitting layer being formed in the notch portion.

In light of the foregoing, an object of one aspect of the disclosure is to provide a vapor deposition mask and a vapor deposition device capable of forming a notch portion in a display area without causing a display defect.

Solution to Problem

In order to solve the problem described above, a vapor deposition mask according to an aspect of the disclosure is a vapor deposition mask used to manufacture a display device including a notch portion in a display area. The vapor deposition mask includes an FMM sheet in close contact with a substrate on which a film is to be formed and including an opening region provided with a plurality of openings to form a film of a vapor deposition material on the substrate, and a first cover sheet covering a part of the FMM sheet. The first cover sheet includes a trunk portion and a notch forming portion that protrudes from the trunk portion and prevents film formation on the notch portion, and a thickness of at least a part of the notch forming portion is smaller than a thickness of the trunk portion.

In order to solve the problem described above, a vapor deposition mask according to an aspect of the disclosure is a vapor deposition mask used to manufacture a display device including a notch portion in a display area. The vapor deposition mask includes an FMM sheet in close contact with a substrate on which a film is to be formed and including an opening region provided with a plurality of openings to form a film of a vapor deposition material on the substrate, and a first cover sheet covering a part of the FMM sheet. The first cover sheet includes a trunk portion and a notch forming portion that protrudes from the trunk portion and prevents film formation on the notch portion, and a thickness of at least a part of the notch forming portion of the first cover sheet is 1 to 8 times a thickness of the FMM sheet.

In order to solve the problem described above, a vapor deposition device according to an aspect of the disclosure is a vapor deposition device used to manufacture a display device including a notch portion in a display area. The vapor deposition device includes a vapor deposition mask used to form a film of a vapor deposition material on a substrate on which a film is to be formed, and a magnet plate configured to bring the vapor deposition mask into close contact with the substrate by a magnetic force. The vapor deposition mask includes an FMM sheet that includes an opening region provided with a plurality of openings to form the film of the vapor deposition material on the substrate, and a first cover sheet that covers a part of the FMM sheet. The first cover sheet includes a trunk portion and a notch forming portion that protrudes from the trunk portion and prevents film formation on the notch portion, and a thickness of at least a part of the notch forming portion is smaller than a thickness of the trunk portion.

Advantageous Effects of Disclosure

According to an aspect of the disclosure, a notch portion can be formed in a display area without causing a display defect.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

Figure 1:
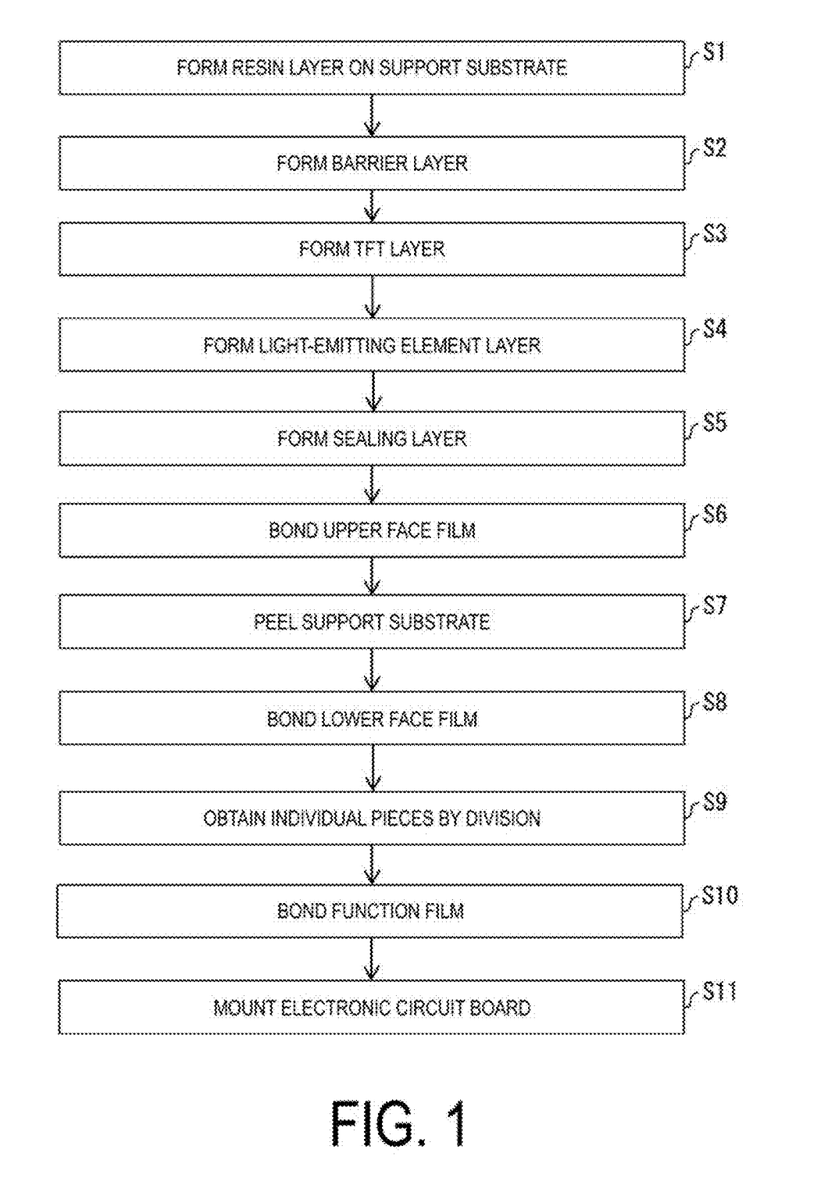
FIG. 1 is a flowchart illustrating an example of a method of manufacturing a display device.
Figure 2:
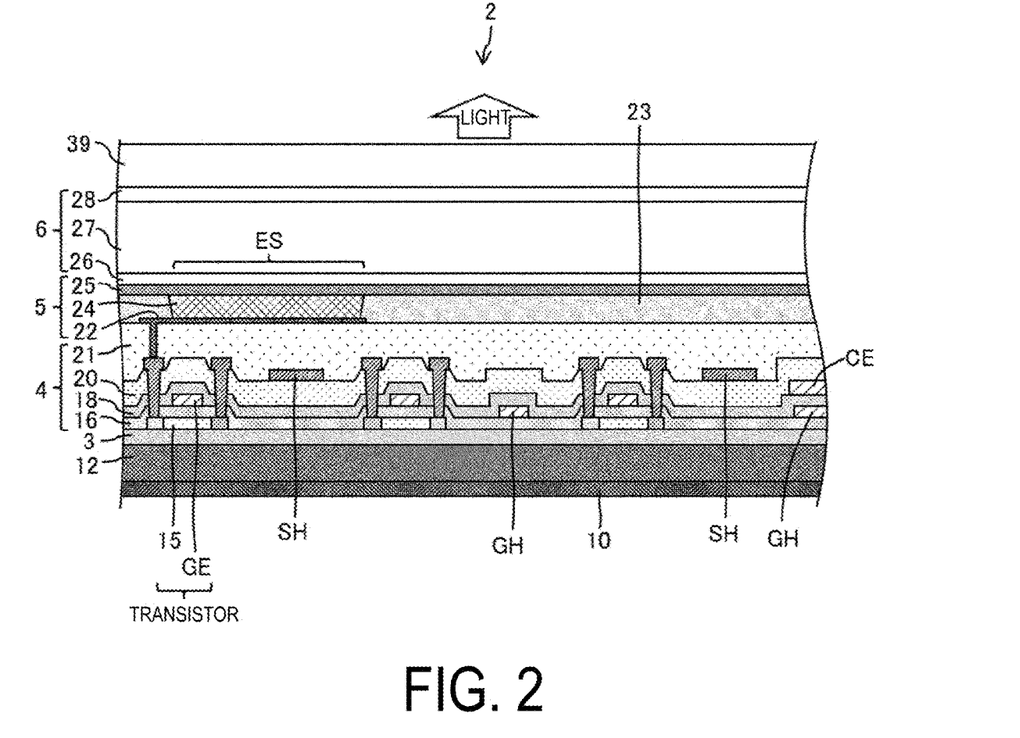
FIG. 2 is a cross-sectional view illustrating a configuration example of a display region of the display device.

FIG. 1 is a flowchart illustrating an example of a method of manufacturing an EL display device 2. FIG. 2 is a cross-sectional view illustrating a configuration of a display region of the EL display device 2.

When the flexible EL display device 2 is manufactured, as illustrated in FIG. 1 and FIG. 2, first, a resin layer 12 is formed on a transparent support substrate (a mother glass, for example) (step S1). Next, a barrier layer 3 is formed (step S2). Next, a TFT layer 4 is formed (step S3). Next, a top-emitting type light-emitting element layer 5 is formed (step S4). Next, a sealing layer 6 is formed (step S5). Next, an upper face film is bonded to the sealing layer 6 (step S6).

Next, the support substrate is peeled from the resin layer 12 by irradiation of laser light or the like (step S7). Next, a lower face film 10 is bonded to the lower face of the resin layer 12 (step S8). Next, a layered body including the lower face film 10, the resin layer 12, the barrier layer 3, the TFT layer 4, the light-emitting element layer 5, and the sealing layer 6 is divided and a plurality of individual pieces are obtained (step S9). Next, a function film 39 is bonded on the obtained individual pieces (step S10). Next, an electronic circuit board (an IC chip and an FPC, for example) is mounted on a portion (a terminal portion) of a region (a non-display region, or a frame) outside the display region in which a plurality of subpixels are formed (step S11). Note that steps S1 to S11 are performed using a display device manufacturing apparatus (including a film formation apparatus that performs each of steps S1 to S5).

Examples of the material of the resin layer 12 include a polyimide. A portion of the resin layer 12 can be replaced by a bilayer resin film (a polyimide film, for example) and an inorganic insulating film sandwiched therebetween.

The barrier layer 3 is a layer that inhibits foreign matters such as water and oxygen from reaching the TFT layer 4 and the light-emitting element layer 5, and can be configured, for example, by a silicon oxide film, a silicon nitride film, or a silicon oxynitride film, or by a layered film of these, formed by chemical vapor deposition (CVD).

The TFT layer 4 includes a semiconductor film 15, an inorganic insulating film 16 (a gate insulating film) that is an upper layer overlying the semiconductor film 15, a gate electrode GE and a gate wiring line GH that are an upper layer overlying the inorganic insulating film 16, an inorganic insulating film 18 that is an upper layer overlying the gate electrode GE and the gate wiring line GH, a capacitance electrode CE that is an upper layer overlying the inorganic insulating film 18, an inorganic insulating film 20 that is an upper layer overlying the capacitance electrode CE, a source wiring line SH that is an upper layer overlying the inorganic insulating film 20, and a flattening film 21 (an interlayer insulating film) that is an upper layer overlying the source wiring line SH.

The semiconductor film 15 is configured, for example, by a low-temperature polysilicon (LTPS) or an oxide semiconductor (an In—Ga—Zn—O based semiconductor, for example), and a transistor (TFT) is configured to include the semiconductor film 15 and the gate electrode GE. In FIG. 2, the transistor having a top gate structure is illustrated, but the transistor may have a bottom gate structure.

The gate electrode GE, the gate wiring line GH, the capacitance electrode CE, and the source wiring line SH are each formed of a single layer film or a layered film of a metal, for example. The metal includes at least one of aluminum, tungsten, molybdenum, tantalum, chromium, titanium, and copper. The TFT layer 4 in FIG. 2 includes a single semiconductor layer and a three-layer metal layer.

Each of the inorganic insulating films 16, 18, and 20 can be formed of, for example, a silicon oxide (SiOx) film or a silicon nitride (SiNx) film, or a layered film of these, formed using CVD. The flattening film 21 can be formed of, for example, a coatable organic material such as a polyimide or acrylic.

The light-emitting element layer 5 (an OLED layer, for example) includes an anode 22 that is an upper layer overlying the flattening film 21, an anode cover film 23 that has insulating properties and covers an edge of the anode 22, an electroluminescence (EL) layer 24 that is an upper layer overlying the anode cover film 23, and a cathode 25 that is an upper layer overlying the EL layer 24. The anode cover film 23 can be formed by applying an organic material, such as a polyimide or acrylic, and then by patterning the organic material by photolithography, for example.

For each of the subpixels, a light-emitting element ES (OLED: organic light emitting diode, or QLED: quantum dot diode, for example) including the island-shaped anode 22, the EL layer 24, and the cathode 25 is formed in the light-emitting element layer 5, and a subpixel circuit for controlling the light-emitting element ES is formed in the TFT layer 4.

For example, the EL layer 24 is formed by layering a hole injection layer, a hole transport layer, a light-emitting layer, an electron transport layer, and an electron injection layer, in this order from the lower layer side. The light-emitting layer is formed in an island shape, in an opening of the anode cover film 23 (for each of the subpixels) by vapor deposition or an ink-jet method. Other layers are formed in an island shape or a solid-like shape (common layer). A configuration is also possible in which one or more layers are not formed, out of the hole injection layer, the hole transport layer, the electron transport layer, and the electron injection layer.

When a light-emitting layer of the OLED is formed by vapor deposition, a vapor deposition mask is used. The vapor deposition mask includes a sheet-shaped fine metal mask (FMM) sheet including a number of openings. The FMM sheet is made from an invar material, for example, and an island-shaped light-emitting layer (corresponding to one subpixel) is formed by an organic material that has passed through one of the openings.

The light-emitting layer of the QLED can be formed as the island-shaped light-emitting layer (corresponding to one subpixel), for example, by ink-jet application of a solvent in which quantum dots are diffused.

The anode (anode electrode) 22 is formed by layering of indium tin oxide (ITO) and silver (Ag) or an alloy containing Ag, for example, and has light reflectivity. The cathode (cathode electrode) 25 can be configured by a transparent conductive material such as an MgAg alloy (an extremely thin film), ITO, indium zinc oxide (IZO), and the like.

When the light-emitting element ES is the OLED, positive holes and electrons recombine inside the light-emitting layer in response to a drive current between the anode 22 and the cathode 25, and light is emitted in a process in which excitons, which are generated by the recombination, transition into a ground state. Since the cathode 25 is transparent and the anode 22 has the light reflectivity, the light emitted from the EL layer 24 travels upward and becomes top-emitting.

When the light-emitting element ES is the QLED, the positive holes and the electrons recombine inside the light-emitting layer in response to the drive current between the anode 22 and the cathode 25, and light (fluorescence) is emitted in a process in which the excitons, which are generated by the recombination, transition from a conduction band level (conduction band) to a valence band level (valence band) of the quantum dots.

A light-emitting element (such as an inorganic light-emitting diode) other than the above-described OLED and QLED may be formed in the light-emitting element layer 5.

The sealing layer 6 is transparent, and includes an inorganic sealing film 26 that covers the cathode 25, an organic buffer film 27 that is an upper layer overlying the inorganic sealing film 26, and an inorganic sealing film 28 that is an upper layer overlying the organic buffer film 27. The sealing layer 6 covering the light-emitting element layer 5 inhibits foreign matter, such as water and oxygen, from penetrating to the light-emitting element layer 5.

Each of the inorganic sealing film 26 and the inorganic sealing film 28 is an inorganic insulating film, and can be formed of, for example, a silicon oxide film, a silicon nitride film, or a silicon oxynitride film, or a layered film of these, formed by CVD. The organic buffer film 27 is a transparent organic film having a flattening effect and can be formed of a coatable organic material such as acrylic. The organic buffer film 27 can be formed, for example, by ink-jet application, but a bank for stopping droplets may be provided in a non-display region.

The lower face film 10 is, for example, a PET film that is bonded on the lower face of the resin layer 12 after peeling off the support substrate, for realizing the EL display device 2 with excellent flexibility. The function film 39 has at least one of an optical compensation function, a touch sensor function, and a protection function, for example.

Although the flexible EL display device 2 is described above, when manufacturing the non-flexible EL display device 2, since the formation of the resin layer, the replacement of the substrate, and the like are not generally required, for example, after a layering process from step S2 to step S5 is performed on a glass substrate, the processing moves to step S9.

First Embodiment

A first embodiment of the disclosure present invention will be described below with reference to FIG. 3 to FIG. 8.

Figure 3:
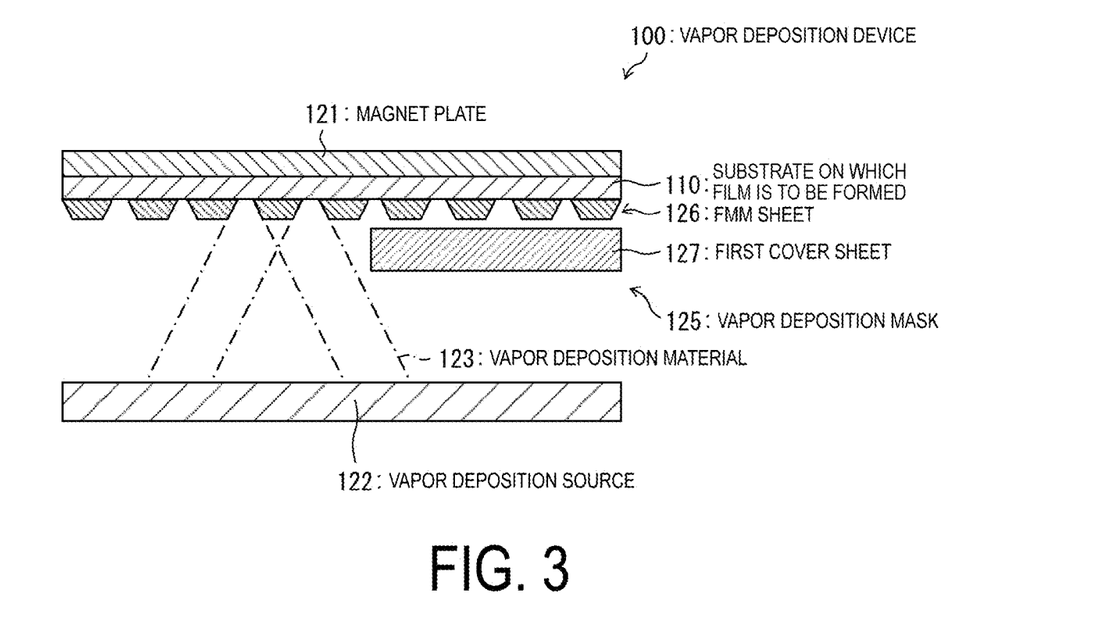
FIG. 3 is a cross-sectional view illustrating a schematic configuration of a vapor deposition device according to a first embodiment.

FIG. 3 is a cross-sectional view illustrating a schematic configuration of a vapor deposition device 100 according to the first embodiment.

The vapor deposition device 100 is a device for forming a vapor deposition film formed of a vapor deposition material 123, in a film formation area 111 of a substrate (110) on which a film is to be formed. Note that in the present embodiment, a case is described, as an example, in which the light-emitting element layer 5 of the EL display device 2 is formed as the vapor deposition film.

The vapor deposition device 100 includes a vapor deposition mask 125, a vapor deposition source 122, and a magnet plate 121, and is configured such that those components are housed in a film formation chamber provided with a rotation mechanism, a deposition prevention plate, a shutter, and the like. Note that although not illustrated, a vacuum pump, an air outlet, and the like are provided in the film formation chamber, in order to keep the interior of the film formation chamber in a vacuum state.

The vapor deposition mask 125 is a mask for forming the vapor deposition film formed of the vapor deposition material 123 in the film formation area 111 of the substrate 110. The vapor deposition mask 125 is formed by a magnetic body, and is disposed in close contact with the film formation area 111 side of the substrate 110. The vapor deposition mask 125 is adhered to the film formation area 111 side of the substrate 110 by the magnetic force of the magnet plate 121, which is provided on a surface of the substrate 110 on the opposite side from the film formation area 111, and is configured to be in close contact with the substrate 110.

The vapor deposition source 122 is a container that stores the vapor deposition material 123. The vapor deposition source 122 is disposed at a position facing the film formation area 111 of the substrate 110, with the vapor deposition mask 125 interposed therebetween. Note that the vapor deposition source 122 may include a load-lock type pipe, for example, and may be configured such that the vapor deposition material 123 is supplied from the outside.

The vapor deposition source 122 includes an ejection port for ejecting the vapor deposition material 123 as vapor deposition particles on a surface of the substrate 110 on a side facing the film formation area 111. The vapor deposition source 122 heats the vapor deposition material 123 to be evaporated or sublimated, in order to generate gaseous vapor deposition particles. The vapor deposition source 122 ejects the generated gaseous vapor deposition particles from the ejection port toward the film formation area 111 of the substrate 110. The vapor deposition particles ejected toward the film formation area 111 of the substrate 110 pass through openings 26r, 26g, and 26b of the vapor deposition mask 125, and the light-emitting layer corresponding to each of the openings 26r, 26g, and 26b is formed in the film formation area 111.

Configuration of Vapor Deposition Mask 125

Figure 4:
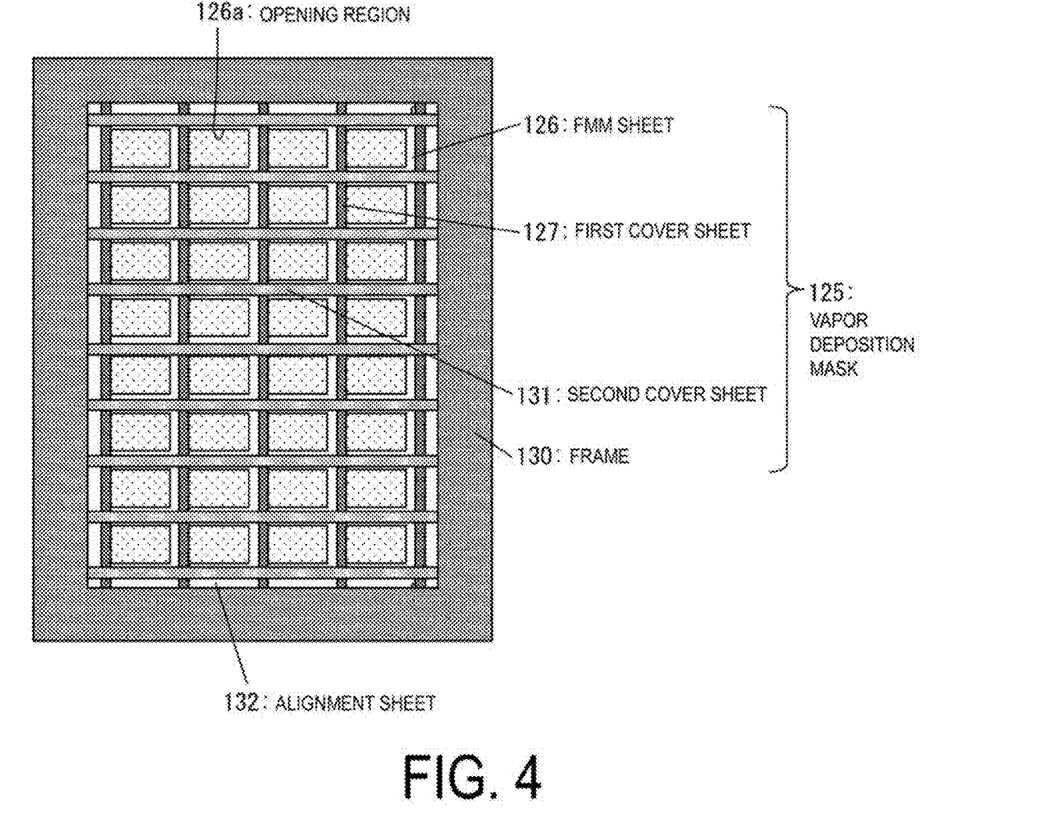
FIG. 4 is a plan view illustrating a configuration of a vapor deposition mask according to the first embodiment.

FIG. 4 is a plan view illustrating a configuration of the vapor deposition mask 125.

As illustrated in FIG. 4, the vapor deposition mask 125 includes FMM sheets 126, first cover sheets 127, second cover sheets 131, and a frame 130.

Figure 6:
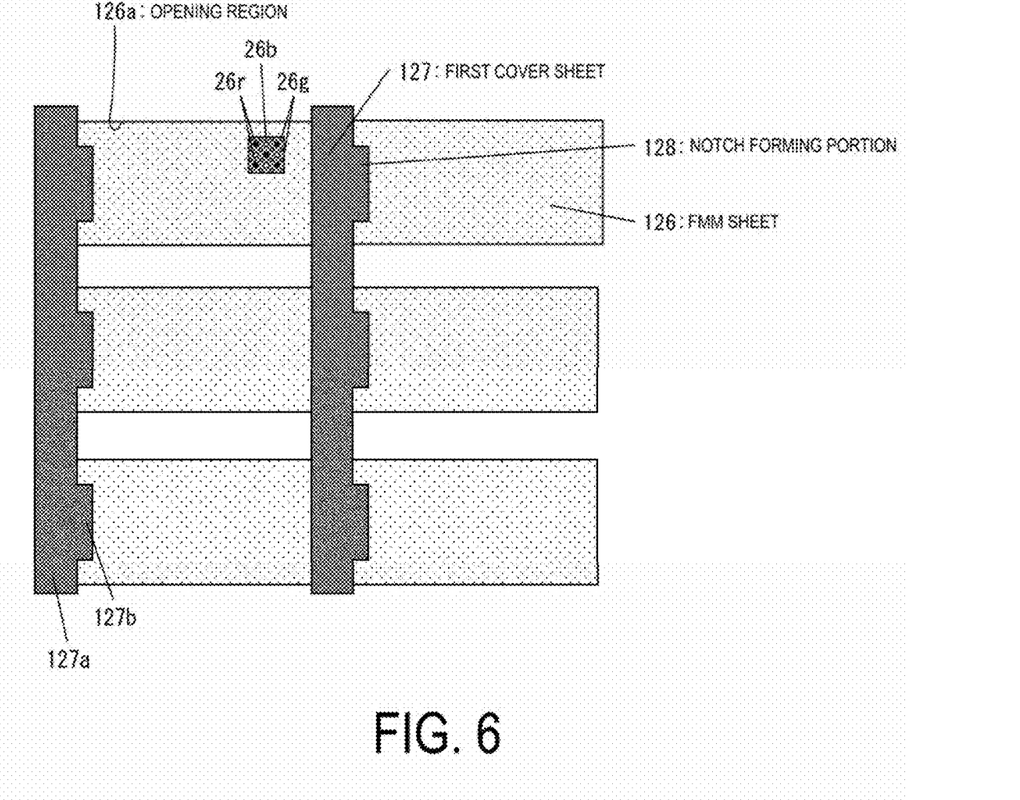
FIG. 6 is a plan view schematically illustrating a configuration of a first cover sheet.

The FMM sheet 126 includes opening regions 126a provided with a plurality of the openings 26r, 26g, and 26b that are used for forming a film by depositing the vapor deposition material 123 on the film formation area 111 of the substrate 110 (see FIG. 6).

Here, the opening 26r is a through hole for forming a light-emitting layer of R, of RGB, on the substrate on which a film is to be formed by vapor deposition. Further, the opening 26g is a through hole for forming a light-emitting layer of G, of RGB, on the substrate on which a film is to be formed by vapor deposition. The opening 26b is a through hole for forming a light-emitting layer of B, of RGB, on the substrate on which a film is to be formed by vapor deposition.

Note that, in FIG. 6, for convenience of explanation, the openings 26r, 26g, and 26b are illustrated as being provided in the opening regions 126a. However, at a time of actual vapor deposition, each of the light-emitting layers is vapor-deposited by individually using the vapor deposition mask 125 provided with the FMM sheet 126 in which the openings 26r used for vapor-depositing the light-emitting layer of R are formed in the opening regions 126a, the vapor deposition mask 125 provided with the FMM sheet 126 in which the openings 26g used for vapor-depositing the light-emitting layer of G are formed in the opening regions 126a, and the vapor deposition mask 125 provided with the FMM sheet 126 in which the openings 26b used for vapor-depositing the light-emitting layer of B are formed in the opening regions 126a.

The FMM sheet 126 is a sheet having a strip shape, and a plurality of the opening regions 126a are provided side by side in the long side direction. The opening region 126a is provided with the plurality of openings 26r, 26g, and 26b, through which the vapor deposition material 123 passes in a vapor deposition process for vapor-depositing the vapor deposition material 123 on the film formation area 111, and is formed in a shape corresponding to the display screen of the EL display device.

In the example illustrated in FIG. 4, four of the slot-shaped opening regions 126a are provided side by side in the long side direction of the FMM sheet 126. Note that the shape and number of the opening regions 126a formed in the FMM sheet 126 is not limited thereto. The opening region 126a is formed in the FMM sheet 126 by laser processing or the like, with high positional precision.

The FMM sheet 126 is formed of a magnetic metal having magnetic properties such as iron, nickel, an invar (an iron-nickel alloy), SUS430, and the like. Note that, among those magnetic metals, the invar, which is the iron-nickel alloy having low heat-induced deformation, can be favorably used. Since the FMM sheet 126 is formed of the magnetic metal in this manner, the FMM sheet 126 is disposed in close contact with the substrate 110 by the magnetic force of the magnet plate 121.

The vapor deposition mask 125 is configured by a plurality of the strip-shaped FMM sheets 126 arranged side by side such that the long side direction of each of the FMM sheets 126 are in parallel to each other. As a result, in the vapor deposition mask 125, the opening regions 126a provided with the plurality of openings 26r, 26g, and 26b are disposed in a matrix pattern in order to cause the vapor deposition material 123 to pass through.

The first cover sheet 127 is disposed so as to extend in the short side direction of the FMM sheet 126. A plurality of the first cover sheets 127 extend over an arrangement direction in which the plurality of FMM sheets 126 are arranged in parallel to each other, and are arranged side by side in the long side direction of the FMM sheet 126. The first cover sheet 127 is preferably arranged along an edge of the opening region 126a.

The first cover sheet 127 functions as a beam that receives the dead weight of the strip-shaped FMM sheet 126, and prevents the FMM sheet 126 from slacking due to its own weight. Further, the first cover sheet 127 is formed of a magnetic metal having magnetic properties such as iron, nickel, the invar (the iron-nickel alloy), SUS430, and the like. Since the first cover sheet 127 is formed of the magnetic metal in this manner, the first cover sheet 127 is adhered to the substrate 110 side by the magnetic force of the magnet plate 121, and presses the FMM sheet 126 against the substrate 110.

The second cover sheet 131 is disposed so as to extend in the long side direction of the FMM sheet 126. The second cover sheet 131 is arranged so as to close a gap between the plurality of FMM sheets 126 arranged in parallel to each other. The second cover sheet 131 is formed of a magnetic metal having magnetic properties, and is adhered to the substrate 110 side by the magnetic force of the magnet plate 121.

The frame 130 holds the FMM sheets 126, the first cover sheets 127, and the second cover sheets 131 arranged in this order from the side closer to the substrate 110. The frame 130 is formed of a magnetic metal having magnetic properties, and is preferably formed of the invar.

An alignment sheet 132 is affixed to a short side portion of the frame 130. An alignment mark for the film formation area 111 of the substrate 110 is provided on the alignment sheet 132. The FMM sheets 126 are bonded to the frame 130 in alignment with the alignment mark. As a result, the FMM sheets 126 can be precisely positioned in relation to the film formation area 111 of the substrate 110.

Configuration of First Cover Sheet 127

Figure 5:
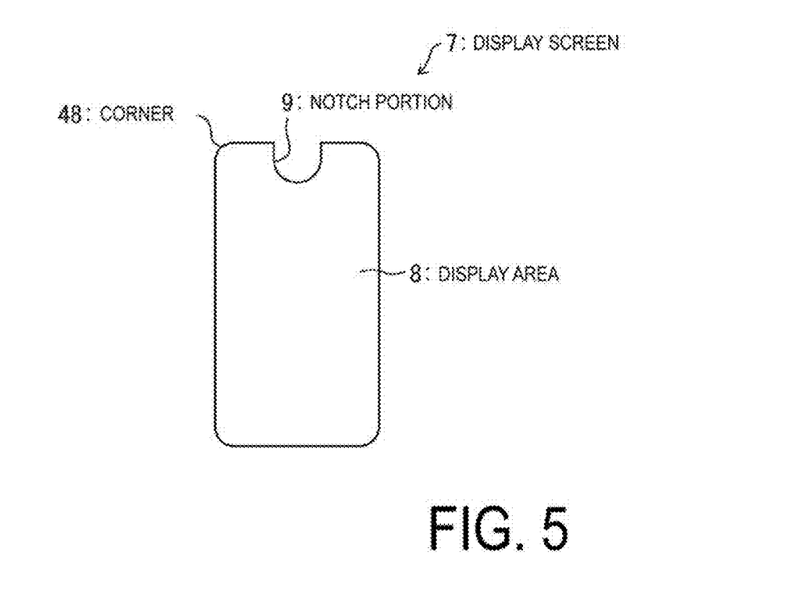
FIG. 5 is a plan view illustrating a configuration of a display screen of the display device.
Figure 7:
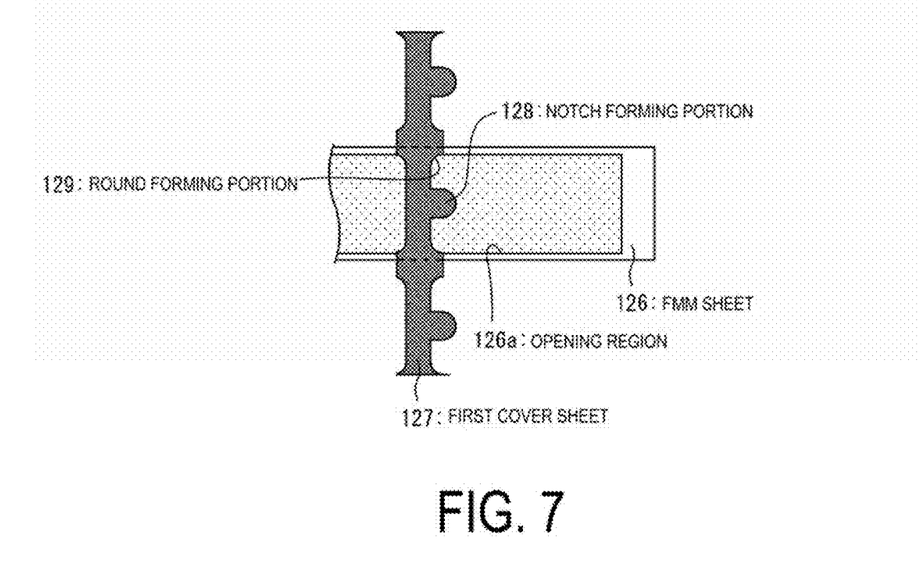
FIG. 7 is a plan view schematically illustrating the configuration of the first cover sheet.

FIG. 5 is a plan view illustrating a configuration of a display screen 7 of the EL display device 2. FIG. 6 and FIG. 7 are plan views schematically illustrating a configuration of the first cover sheet 127. Note that in FIG. 5 and FIG. 6, in order to simplify the explanation, the configuration of the vapor deposition mask 125 other than the first cover sheet 127 and the opening region 126a of the FMM sheet 126 is omitted. Further, a notch forming portion 128 illustrated in FIG. 6 is illustrated using a case in which a notch portion is formed that has a shape different from that of a notch portion 9 illustrated in FIG. 5.

As illustrated in FIG. 5, in the display screen 7 of the EL display device 2, the notch portion 9, in which no display is performed, is formed inside a display area 8. Further, corners 48, which are each of the four corners of the display area 8 of the display screen 7, are each formed in a round shape.

When a vapor deposition film is present in a cross section on which notch machining is performed, the notch portion 9 deteriorates due to moisture or oxygen. Therefore, an end face of the notch portion 9 needs to be sealed by a barrier film or the like. Thus, in the vapor deposition process, the notch portion 9 needs to be covered so that the vapor deposition material 123 is not deposited on the notch portion 9.

As illustrated in FIG. 6, the first cover sheet 127 is provided with a trunk portion 127a and the notch forming portion 128. The notch forming portion 128 is a region for preventing film formation on the notch portion 9, and is formed so as to protrude from the trunk portion 127a. The notch forming portion 128 protrudes from the trunk portion 127a of the first cover sheet 127 so as to extend in the short side direction of the FMM sheet 126, into the opening region 126a of the FMM sheet 126.

The notch forming portion 128 has a shape corresponding to the notch portion 9 provided in the display area 8. The notch forming portion 128 covers the openings 26r, 26g, and 26b that are present in a section, corresponding to the notch portion 9, of the opening region 126a of the FMM sheet 126, thereby preventing the film formation on the notch portion 9.

A plurality of the notch forming portions 128 are provided along the long side direction of the first cover sheet 127. Each of the notch forming portions 128 is configured to cover a position in which the corresponding notch portion 9 of the opening region 126a is formed when the first cover sheet 127 is bonded to the frame 130.

It is sufficient that the notch forming portion 128 have the shape corresponding to the notch portion 9, and as illustrated in FIG. 6, the notch forming portion 128 may have a shape whose longitudinal direction is the extending direction of the first cover sheet 127, such as a wide rectangular shape, for example. Further, as illustrated in FIG. 7, the notch forming portion 128 may have a semi-elliptical shape or the like.

Further, as illustrated in FIG. 7, the first cover sheet 127 is provided with a round forming portion 129 for rounding the corner 48 of the display area 8. The round forming portion 129 of the first cover sheet 127 covers the openings 26r, 26g, and 26b that are present in a section, corresponding to the corner 48, of the opening region 126a of the FMM sheet 126, thereby preventing film formation on the corner 48. As a result, each of the four corners of the display area 8 is formed in the round shape.

Figure 8:
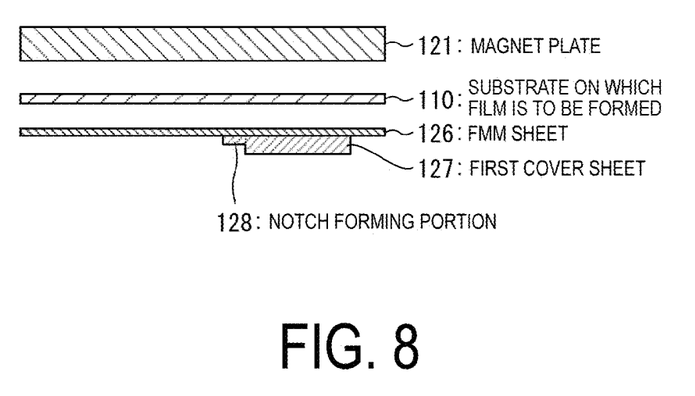
FIG. 8 is a cross-sectional view illustrating the configuration of the first cover sheet.

FIG. 8 is a cross-sectional view illustrating the configuration of the first cover sheet 127. As illustrated in FIG. 8, the notch forming portion 128 of the first cover sheet 127 is configured such that the surface thereof on the side of the FMM sheet 126 is parallel to the FMM sheet 126. As a result, it is possible to prevent a magnetic field of the magnet plate 121 from being unevenly applied between the notch forming portion 128 of the first cover sheet 127 and the FMM sheet 126, and thereby to prevent the FMM sheet 126 from being distorted.

Figure 9:
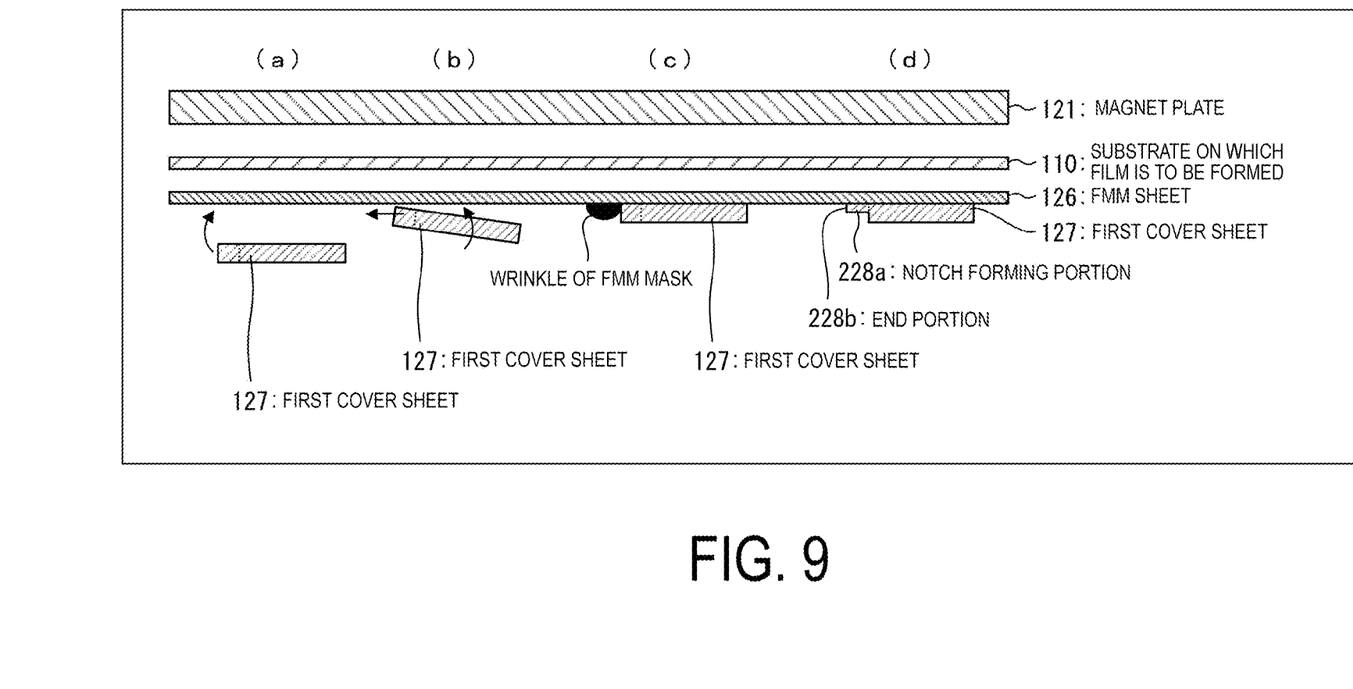
FIG. 9 is a diagram schematically illustrating movement of the first cover sheet at a time of attachment.

(a) to (d) of FIG. 9 are diagrams schematically illustrating movement of the first cover sheet when the first cover sheet 127 is adhered to the magnet plate 121. As illustrated in (d) of FIG. 9, the first cover sheet 127 is configured such that the thickness of at least a part of the notch forming portion 128 is formed to be smaller than the thickness of the trunk portion 127a.

Since the notch forming portion 128 protrudes from the trunk portion 127a, when the first cover sheet 127 is adhered to the magnet plate 121 as illustrated in FIG. 9(a), the first cover sheet 127 easily comes into contact with the FMM sheet 126 from the notch forming portion 128 as illustrated in FIG. 9(b). Thus, as a result of the entirety of the first cover sheet 127 failing to evenly come into contact with the FMM sheet 126, and the first cover sheet 127 coming into contact with the FMM sheet 126 from the notch forming portion 128, the periphery of the notch portion 9 of the FMM sheet 126 may be wrinkled as illustrated in FIG. 9(c).

When a wrinkle is formed in the FMM sheet 126 at the periphery of the notch portion 9 in this manner, color mixing occurs, as a result of the gap between the substrate 110 and the FMM sheet 126 increasing in the wrinkled section, and the vapor deposition film being placed on the adjacent multi-color pixels.

In contrast, in the present embodiment, since the thickness of the notch forming portion 128 is made smaller than the thickness of the trunk portion 127a, as illustrated in (d) of FIG. 9, the effect of the magnetic force of the magnet plate on the notch forming portion 128 can be made smaller than that on the trunk portion 127a. Thus, the entirety of the first cover sheet 127 can be evenly bonded to the FMM sheet 126, and it is thus possible to prevent the wrinkle from being formed on the FMM sheet 126.

By causing the thickness of at least the part of the notch forming portion 128 to be smaller than the thickness of the trunk portion 127a in this manner, the color drift does not occur at the periphery of the notch portion 9, and the light-emitting layer is not formed in the notch portion 9. Thus, the notch portion 9 can be formed in the display area 8 without causing a display defect in the display area 8 of the display screen 7.

Further, the thickness of the round forming portion 129, of the first cover sheet 127, for rounding the corner 48 of the display area 8 is formed to be smaller than the thickness of the trunk portion 127a. The thickness of the round forming portion 129 may be formed to be the same thickness as that of a section, of the notch forming portion 128, whose thickness is formed to be smaller than the thickness of the trunk portion 127a, for example. As a result, the effect of the magnetic force of the magnet plate 121 on the round forming portion 129 can be reduced. Thus, when the round forming portion 129 comes into contact with the FMM sheet 126, it is possible to prevent a wrinkle from being formed at the periphery of the corner 48 of the FMM sheet 126.

By forming the thickness of the round forming portion 129 to be smaller than the thickness of the trunk portion 127a in this manner, the color drift does not occur at the periphery of the corner 48, and the light-emitting layer is not formed on the outer side of the corner 48. Thus, the corner 48 of the display area 8 can be rounded without causing a display defect in the display area 8 of the display screen 7.

Modified Example

Figure 10:
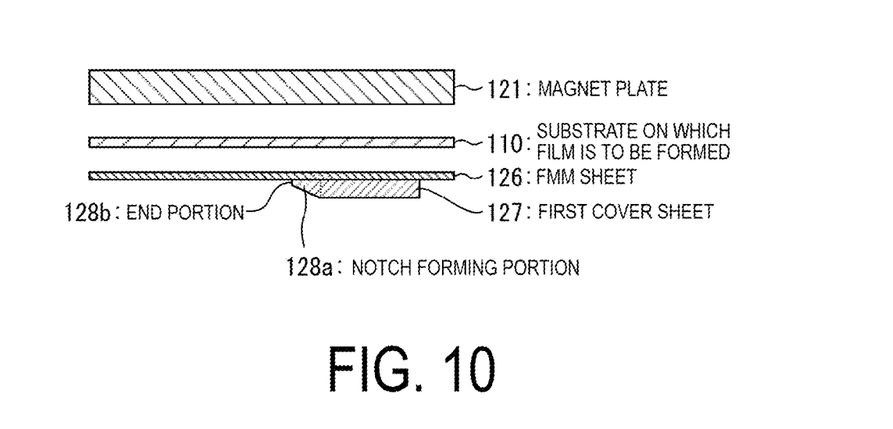
FIG. 10 is a cross-sectional view illustrating a configuration of a first cover sheet of a modified example.

FIG. 10 is a cross-sectional view illustrating a configuration of a first cover sheet 127 of a modified example. As illustrated in FIG. 10, the first cover sheet 127 is configured such that a notch forming portion 128 protrudes from a trunk portion 127a of the first cover sheet 127. Further, the notch forming portion 128 has a shape in which the thickness thereof gradually decreases from a base section 127b of the notch forming portion 128 in the protruding direction, the base section 127b being continuously formed with the trunk portion 127a. That is, the thickness of a section of the notch forming portion 128 extending over the opening region 126a gets thinner toward the interior of the opening region 126a.

Since the notch forming portion 128 has the shape in which the thickness thereof gradually decreases in the protruding direction in this manner, when the first cover sheet 127 comes into contact with the FMM sheet 126, it is possible to prevent the first cover sheet 127 from coming into contact with the FMM sheet 126 from an end portion 128b, in the protruding direction, of the notch forming portion 128. Thus, due to the effect of the notch forming portion 128, it is possible to prevent a wrinkle from being formed at the periphery of the notch portion 9 of the FMM sheet 126.

As a result, the notch portion 9 can be formed without causing the color drift to occur at the periphery of the notch portion 9, and without forming the light-emitting layer in the notch portion 9, and without causing a display defect to occur in the display area 8 of the display screen 7.

Second Embodiment

A second embodiment of the disclosure will be described below. Note that, for convenience of explanation, members having the same function as the members described in the first embodiment are denoted with the same reference symbols, and a description thereof is not repeated. Note that since a configuration of the vapor deposition device 100 according to the second embodiment is the same as that of the configuration of the above-described first embodiment, which is described with reference to FIG. 3 to FIG. 7, a description thereof will be omitted.

Figure 11:
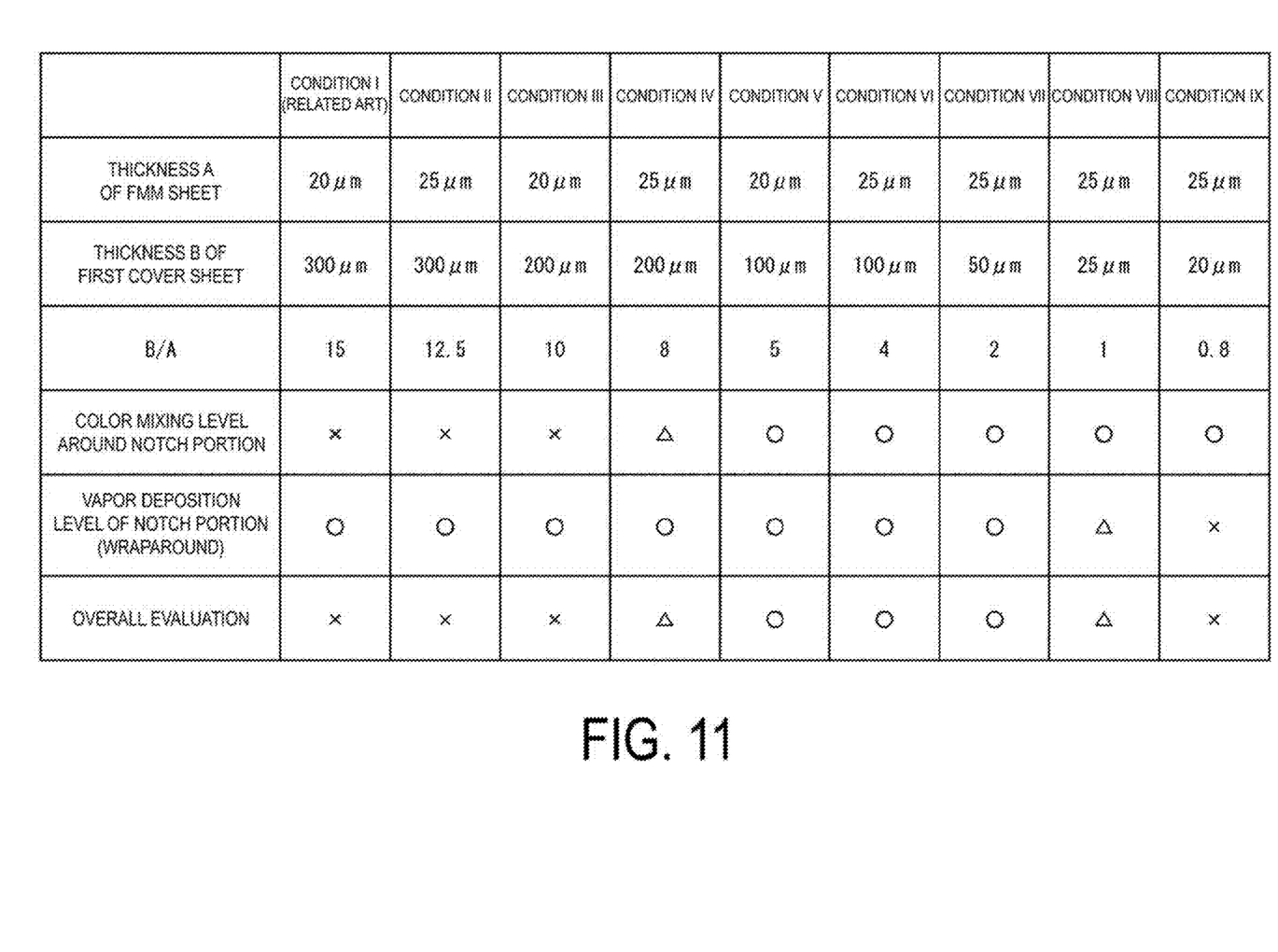
FIG. 11 is a diagram illustrating relationships between configurations of vapor deposition masks and the presence/absence of a display defect of the display screen.

FIG. 11 is a diagram illustrating a configuration of each of vapor deposition masks according to the second embodiment, and the presence/absence of a display defect of the display screen 7 at the periphery of the notch portion 9 when vapor deposition is performed using each of the vapor deposition masks.

When a thickness B of the first cover sheet 127 is greater than a thickness A of the FMM sheet 126 by a predetermined amount or more, the first cover sheet 127 is attracted to the magnet plate 121 in advance of the FMM sheet 126, and with a greater force. As a result, the FMM sheet 126 may be distorted at the periphery of the first cover sheet 127, particularly, at the periphery of the notch portion 9. When the distortion of the FMM sheet 126 occurs in this manner, the color drift (color mixing) occurs in the display screen 7.

As illustrated by Conditions I to III in FIG. 11, when the thickness B of the first cover sheet 127 was 10 to 15 times the thickness A of the FMM sheet 126, the color drift occurred at the periphery of the notch portion 9 of the display screen 7. Further, as illustrated by Condition IV, when the thickness B of the first cover sheet 127 was 8 times the thickness A of the FMM sheet 126, the color drift at the periphery of the notch portion 9 of the display screen 7 was improved. Further, as illustrated by Conditions V to VII, when the thickness B of the first cover sheet 127 was 2 to 5 times the thickness A of the FMM sheet 126, no color drift occurred at the periphery of the notch portion 9 of the display screen 7.

Further, as illustrated by Condition VIII, when the thickness B of the first cover sheet 127 was the same as (1 times) the thickness A of the FMM sheet 126, the color drift did not occur at the periphery of the notch portion 9 of the display screen 7, but vapor deposition occurred in the notch portion 9, although only slightly. Furthermore, as illustrated by Condition IX, when the thickness B of the first cover sheet 127 was thinner than (0.8 times) the thickness A of the FMM sheet 126, the color drift did not occur at the periphery of the notch portion 9 of the display screen 7, but vapor deposition occurred in the notch portion 9.

It has been understood that when the thickness B of the first cover sheet 127 is thinner than the thickness A of the FMM sheet 126, an adhesion strength between the first cover sheet 127 and the magnet plate 121 is weakened, and a gap is generated between the first cover sheet 127 and the FMM sheet 126. When the gap is generated between the first cover sheet 127 and the FMM sheet 126 in this manner, the vapor deposition material 123 wraps around and flows into the gap between the first cover sheet 127 and the FMM sheet 126, and as a result, the vapor deposition is performed on the notch portion 9. Therefore, it has been understood that even when the thickness B of the first cover sheet 127 is thinner than the thickness A of the FMM sheet 126, a display defect occurs in the display area 8 of the display screen 7.

In this manner, it is sufficient that the thickness B of the first cover sheet 127 be 1 to 8 times the thickness A of the FMM sheet 126, and the thickness B is preferably 2 to 5 times the thickness A. Further, in order to prevent the color drift at the periphery of the notch portion 9, of the first cover sheet 127, the thickness of at least the notch forming portion 128 may be 1 to 8 times the thickness of the FMM sheet, or the thickness of at least a part of the notch forming portion 128 may be 1 to 8 times the thickness of the FMM sheet.

By causing the thickness B of the first cover sheet 127 to be 1 to 8 times the thickness of the FMM sheet in at least the notch forming portion 128 in this manner, it is possible to reduce the effect of the magnetic force of the magnet plate 121 on the notch forming portion 128. Thus, it is possible to prevent a wrinkle from being formed at the periphery of the notch portion 9 of the FMM sheet 126, and thereby, the occurrence of the color drift at the periphery of the notch portion 9 or the formation of the light-emitting layer in the notch portion 9 can be prevented. As a result, the notch portion 9 can be formed in the display area 8 without causing a display defect in the display area 8 of the display screen 7.

Furthermore, as described in the first embodiment, the thickness of the notch forming portion 128 is preferably configured to be smaller than the thickness of the trunk portion 127a, and the thickness of the notch forming portion 128 is preferably ⅛ to 1 times the thickness of the trunk portion 127a.

Further, as described in the first embodiment, the thickness of the round forming portion 129 of the first cover sheet 127 is also preferably configured to be smaller than the thickness of the trunk portion 127a, and the thickness of the round forming portion 129 is preferably ⅛ to 1 times the thickness of the trunk portion 127a.

By causing the thickness of the notch forming portion 128 and the thickness of the round forming portion 129 to be ⅛ to 1 times the thickness of the trunk portion 127a in this manner, the notch forming portion 128 and the round forming portion 129 can be prevented from coming into contact with the FMM sheet 126 in advance of the trunk portion 127a. As a result, the entirety of the first cover sheet 127 is evenly brought into contact with the FMM sheet 126, and the wrinkle can be prevented from being formed in the FMM sheet 126. Thus, no display defect is caused to occur in the display area 8 of the display screen 7.

Supplement

An electro-optical element (an electro-optical element whose luminance and transmittance are controlled by an electric current) that is provided in a display device according to the present embodiment is not particularly limited. Examples of the display device according to the present embodiment include an organic electroluminescence (EL) display provided with the organic light emitting diode (OLED) as the electro-optical element, an inorganic EL display provided with an inorganic light emitting diode as the electro-optical element, and a quantum dot light emitting diode (QLED) display provided with the QLED as the electro-optical element.

First Aspect

A vapor deposition mask according to a first aspect of the disclosure is a vapor deposition mask used to manufacture a display device including a notch portion in a display area. The vapor deposition mask includes an FMM sheet in close contact with a substrate on which a film to be formed and including an opening region provided with a plurality of openings to form a film of a vapor deposition material on a surface of the substrate, and a first cover sheet covering a part of the FMM sheet. The first cover sheet includes a trunk portion and a notch forming portion that protrudes from the trunk portion and prevents film formation on the notch portion, and a thickness of at least a part of the notch forming portion is smaller than a thickness of the trunk portion.

Second Aspect

In the vapor deposition mask according to the second aspect of the disclosure, in the first aspect, the notch forming portion may have a shape in which a thickness thereof gradually decreases in a protruding direction.

Third Aspect

In the vapor deposition mask according to a third aspect of the disclosure, in the first or second aspect, the first cover sheet may include a round forming portion for rounding a corner of the display area, and a thickness of the rounding forming portion may be smaller than the thickness of the trunk portion.

Fourth Aspect

In the vapor deposition mask according to a fourth aspect of the disclosure, in the first to third aspects, a surface, on a side of the FMM sheet, of the notch forming portion may be configured to be parallel to the FMM sheet.

Fifth Aspect

The vapor deposition mask according to a fifth aspect of the disclosure may include, in the first to fourth aspects, the FMM sheet having a strip shape, the first cover sheet extending in a short side direction of the FMM sheet, a second cover sheet extending in a long side direction of the FMM sheet, and a frame holding the FMM sheet, the first cover sheet, and the second cover sheet arranged in this order from a side closer to the substrate.

Sixth Aspect

In the vapor deposition mask according to a sixth aspect of the disclosure, in the first to fifth aspects, the notch forming portion may have a shape in which a longitudinal direction thereof is an extending direction of the first cover sheet.

Seventh Aspect

A vapor deposition mask according to a seventh aspect of the disclosure is a vapor deposition mask used to manufacture a display device including a notch portion in a display area. The vapor deposition mask includes an FMM sheet in close contact with a substrate on which a film is to be formed, and including an opening region provided with a plurality of openings to form a film of a vapor deposition material on a surface of the substrate, and a first cover sheet covering a part of the FMM sheet. The first cover sheet includes a trunk portion and a notch forming portion that protrudes from the trunk portion and prevents film formation on the notch portion, and a thickness of at least a part of the notch forming portion of the first cover sheet is 1 to 8 times a thickness of the FMM sheet.

Eighth Aspect

In the vapor deposition mask according to an eighth aspect of the disclosure, in the seventh aspect, a thickness of the notch forming portion may be 1 to 8 times the thickness of the FMM sheet.

Ninth Aspect

In the vapor deposition mask according to a ninth aspect of the disclosure, in the seventh or eighth aspect, the thickness of at least the part of the notch forming portion of the first cover sheet may be $1/8$ to 1 times a thickness of the trunk portion.

Tenth Aspect

In the vapor deposition mask according to a tenth aspect of the disclosure, in the seventh to ninth aspects, the first cover sheet may include a round forming portion for rounding a corner of the display area, and a thickness of the rounding forming portion may be $1/8$ to 1 times the thickness of the trunk portion.

Eleventh Aspect

In the vapor deposition mask according to an eleventh aspect of the disclosure, in the seventh to tenth aspects, a surface, on a side of the FMM sheet, of the notch forming portion may be configured to be parallel to the FMM sheet.

Twelfth Aspect

The vapor deposition mask according to a twelfth aspect of the disclosure may include, in the seventh to eleventh aspects, the FMM sheet having a strip shape, the first cover sheet extending in a short side direction of the FMM sheet, a second cover sheet extending in a long side direction of the FMM sheet, and a frame holding the FMM sheet, the first cover sheet, and the second cover sheet arranged in this order from a side closer to the substrate.

Thirteenth Aspect

In the vapor deposition mask according to a thirteenth aspect of the disclosure, in the seventh to twelfth aspects, the notch forming portion may have a shape in which a longitudinal direction thereof is an extending direction of the first cover sheet.

Fourteenth Aspect

A vapor deposition device according to a fourteenth aspect of the disclosure present invention is a vapor deposition device used to manufacture a display device including a notch portion in a display area. The vapor deposition device includes a vapor deposition mask used to form a film of a vapor deposition material on a surface of a substrate on which a film is to be formed, and a magnet plate configured to bring the vapor deposition mask into close contact with the substrate by a magnetic force. The vapor deposition mask includes an FMM sheet that includes an opening region provided with a plurality of openings to form the film of the vapor deposition material on the surface of the substrate, and a first cover sheet that covers a part of the FMM sheet. The first cover sheet includes a trunk portion and a notch forming portion that protrudes from the trunk portion and prevents film formation on the notch portion, and a thickness of at least a part of the notch forming portion is smaller than a thickness of the trunk portion.

The present invention is not limited to each of the embodiments described above, and various modifications may be made within the scope of the claims. Embodiments obtained by appropriately combining technical approaches disclosed in each of the different embodiments also fall within the technical scope of the present invention. Moreover, novel technical features can be formed by combining the technical approaches disclosed in the embodiments.

What is claimed is:

1. A vapor deposition mask used to manufacture a display device including a notch portion in a display area, the vapor deposition mask comprising:
    a fine metal mask sheet in close contact with a substrate on which a film is to be formed, and including an opening region provided with a plurality of openings to form a film of a vapor deposition material on the substrate; and
    a first cover sheet covering a part of the fine metal mask sheet, wherein:
        the first cover sheet includes a cuboid shaped trunk portion having a length, a width, and a thickness, and
        a notch forming portion protruding from the length side of the trunk portion having a length smaller than the length of trunk portion,
        the notch forming portion overlaps with the opening region and prevents film formation on the notch portion, and
        a thickness of an entirety of the notch forming portion is smaller than the thickness of the trunk portion.

2. The vapor deposition mask according to claim 1, wherein the notch forming portion has a shape in which a thickness thereof gradually decreases in a protruding direction.

3. The vapor deposition mask according to claim 1, wherein the first cover sheet includes a round forming portion for rounding a corner of the display area, and a thickness of the round forming portion is smaller than the thickness of the trunk portion.

4. The vapor deposition mask according to claim 1, wherein a surface, on a side of the fine metal mask sheet, of the notch forming portion is configured to be parallel to the fine metal mask sheet.

5. The vapor deposition mask according to claim 1, comprising:
    the fine metal mask sheet having a strip shape;
    the first cover sheet extending in a short side direction of the fine metal mask sheet;
    a second cover sheet extending in a long side direction of the fine metal mask sheet; and
    a frame holding the fine metal mask sheet, the first cover sheet, and the second cover sheet arranged in this order from a side closer to the substrate.

6. The vapor deposition mask according to claim 1, wherein the notch forming portion has a shape in which a long side direction thereof is an extending direction of the first cover sheet.

7. The vapor deposition mask according to claim 1, wherein the notch forming portion has a semi-elliptical shape.

8. The vapor deposition mask according to claim 1, wherein the notch forming portion has a sloped cross section shape in which a thickness thereof decreases in a protruding direction.

9. The vapor deposition mask according to claim 1, wherein the thickness of the notch forming portion is uniform resulting a stepwise change in thickness between the notch forming portion and the trunk portion.

10. A vapor deposition mask used to manufacture a display device including a notch portion in a display area, the vapor deposition mask comprising:
   a fine metal mask sheet in close contact with a substrate on which a film to be formed, and including an opening region provided with a plurality of openings to form a film of a vapor deposition material on the substrate; and
   a first cover sheet covering a part of the fine metal mask sheet, wherein:
      the first cover sheet includes a cuboid shaped trunk portion having a length, a width, and a thickness, and
      a notch forming portion protruding from the length side of the trunk portion having a length smaller than the length of trunk portion,
      the notch forming portion overlaps with the opening region and prevents film formation on the notch portion,
      a thickness of at least a part of the notch forming portion is 1 to 8 times a thickness of the fine metal mask sheet, and
      a thickness of an entirety of the notch forming portion is smaller than the thickness of the trunk portion.

11. The vapor deposition mask according to claim 10, wherein a thickness of the notch forming portion is 1 to 8 times the thickness of the fine metal mask sheet.

12. The vapor deposition mask according to claim 10, wherein the thickness of at least the part of the notch forming portion of the first cover sheet is $1/8$ to 1 times a thickness of the trunk portion.

13. The vapor deposition mask according to claim 10, wherein the first cover sheet includes a round forming portion for rounding a corner of the display area, and a thickness of the round forming portion is $1/8$ to 1 times the thickness of the trunk portion.

14. The vapor deposition mask according to claim 10, wherein a surface, on a side of the fine metal mask sheet, of the notch forming portion is configured to be parallel to the fine metal mask sheet.

15. The vapor deposition mask according to claim 10, comprising:
   the fine metal mask sheet having a strip shape;
   the first cover sheet extending in a short side direction of the fine metal mask sheet;
   a second cover sheet extending in a long side direction of the fine metal mask sheet; and
   a frame holding the fine metal mask sheet, the first cover sheet, and the second cover sheet arranged in this order from a side closer to the substrate.

16. The vapor deposition mask according to claim 10, wherein the notch forming portion has a shape in which a long side direction thereof is an extending direction of the first cover sheet.

17. The vapor deposition mask according to claim 10, wherein the notch forming portion has a semi-elliptical shape.

18. A vapor deposition device used to manufacture a display device including a notch portion in a display area, the vapor deposition device comprising:
   a vapor deposition mask used to form a film of a vapor deposition material on a substrate on which a film is to be formed; and
   a magnet plate configured to bring the vapor deposition mask into close contact with the substrate by a magnetic force, wherein the vapor deposition mask includes:
      a fine metal mask sheet that includes an opening region provided with a plurality of openings to form the film of the vapor deposition material on the substrate, and
      a first cover sheet that covers a part of the fine metal mask sheet, wherein:
   the first cover sheet includes a cuboid shaped trunk portion having a length, a width, and a thickness, and
   a notch forming portion protruding from the length side of the trunk portion having a length smaller than the length of trunk portion,
   the notch forming portion overlaps with the opening region and prevents film formation on the notch portion, and
   a thickness of an entirety of the notch forming portion is smaller the thickness of the trunk portion.

19. The vapor deposition device according to claim 18, wherein the notch forming portion has a semi-elliptical shape.

* * * * *